United States Patent
Maier et al.

(10) Patent No.: US 9,304,165 B2
(45) Date of Patent: Apr. 5, 2016

(54) METHOD FOR CONTROLLING A STATE MACHINE

(71) Applicants: Gert Maier, Reutlingen (DE); Frank Lustig, Stuttgart (DE); Bernard Haible, Backnang (DE)

(72) Inventors: Gert Maier, Reutlingen (DE); Frank Lustig, Stuttgart (DE); Bernard Haible, Backnang (DE)

(73) Assignee: ROBERT BOSCH GMBH, Stuttgart (DE)

(*) Notice: Subject to any disclaimer, the term of this patent is extended or adjusted under 35 U.S.C. 154(b) by 136 days.

(21) Appl. No.: 13/922,604

(22) Filed: Jun. 20, 2013

(65) Prior Publication Data

US 2013/0346817 A1 Dec. 26, 2013

(30) Foreign Application Priority Data

Jun. 20, 2012 (DE) .......................... 10 2012 210 408

(51) Int. Cl.
- *G06F 11/00* (2006.01)
- *G01R 31/3177* (2006.01)
- *G06F 11/273* (2006.01)
- *G05B 19/045* (2006.01)
- *G06F 9/44* (2006.01)

(52) U.S. Cl.
CPC .......... *G01R 31/3177* (2013.01); *G05B 19/045* (2013.01); *G06F 9/444* (2013.01); *G06F 11/2733* (2013.01)

(58) Field of Classification Search
CPC combination set(s) only.
See application file for complete search history.

(56) References Cited

U.S. PATENT DOCUMENTS

| | | | |
|---|---|---|---|
| 6,925,583 B1 * | 8/2005 | Khu et al. | 714/30 |
| 6,961,884 B1 * | 11/2005 | Draper | 714/726 |
| 7,417,449 B1 * | 8/2008 | Posey et al. | 324/750.3 |
| 8,280,687 B2 * | 10/2012 | Cheng et al. | 702/185 |
| 2002/0062466 A1 * | 5/2002 | Noguchi | 714/738 |
| 2002/0152439 A1 * | 10/2002 | Kim et al. | 714/734 |
| 2002/0184562 A1 * | 12/2002 | Nadeau-Dostie et al. | 714/30 |
| 2003/0079166 A1 * | 4/2003 | Vermeulen et al. | 714/727 |
| 2004/0158784 A1 * | 8/2004 | Abuhamdeh et al. | 714/724 |
| 2007/0100586 A1 * | 5/2007 | Cheng et al. | 702/185 |
| 2007/0208966 A1 * | 9/2007 | Fukuyama et al. | 714/699 |
| 2009/0309621 A1 * | 12/2009 | Hammerschmidt | 324/763 |
| 2009/0319840 A1 * | 12/2009 | Hara | G06F 11/1068 714/718 |
| 2011/0004793 A1 * | 1/2011 | Sul | G11C 29/003 714/718 |
| 2012/0198296 A1 * | 8/2012 | Whetsel | 714/727 |

* cited by examiner

*Primary Examiner* — M. Mujtaba K Chaudry
(74) *Attorney, Agent, or Firm* — Kenyon & Kenyon LLP (57) ABSTRACT

A method and a system for controlling a state machine are described. In the method, a script is used via which each arbitrary path in the state machine. The script is created using a language which includes the "data" command, the "data" command allowing reading and writing of data.

8 Claims, 7 Drawing Sheets

METHOD FOR CONTROLLING A STATE MACHINE

RELATED APPLICATION INFORMATION

The present application claims priority to and the benefit of German patent application no. 10 2012 210 408.9, which was filed in Germany on Jun. 20, 2012, the disclosure of which is incorporated herein by reference.

FIELD OF THE INVENTION

The present invention relates to a method for controlling a state machine, and a system for carrying out the method.

BACKGROUND INFORMATION

A state machine, also referred to as a finite automaton, represents a model of a system composed of states, state transitions, and actions. The automaton is referred to as "finite" when the quantity of states which the automaton is able to accept is finite.

A state stores the information concerning the past; i.e., the state reflects the changes in the input since the start of the system up to the present point in time. A state transition indicates a change in the state of the automaton, and is described by a logical condition that must be met in order to allow the state transition. An action is the output of the automaton which occurs in a certain situation.

A state machine may be represented as a state transition diagram. In addition, different types of transition tables may be utilized.

State machines are primarily used in the development of digital circuits and in the modeling of the application characteristics of control systems, for hardware and software as well as for mixed systems.

A number of methods are known for testing electronic units or electronic hardware. The aim of these methods is to recognize faults in the hardware and to eliminate then, which is also referred to as "debugging."

The so-called Joint Test Action Group (JTAG) refers to a standard which describes a collection of methods for testing and debugging electronic hardware directly in the circuit. The so-called boundary scan test is one method that is presently widely used.

The method is used to test the functionality of integrated circuits while they are in their working environment. For this purpose, these integrated circuits may be soldered to a printed circuit board, for example. A JTAG-capable IC may have components which are completely separate during normal operation and which thus do not impair the function of the component. Only by activating the JTAG function by a sequence is the control of certain functions transferred to JTAG. The JTAG interface to the outside environment is generally implemented as a shift register.

A JTAG component is composed essentially of the following parts:

the test access port (TAP) together with control lines, which is also referred to as a JTAG port or a JTAG interface;

the TAP controller, which controls a state machine which controls the test logic; and two shift registers, the instruction register (IR) and the data register (DR).

The test access port (TAP) includes five control lines:
1. test data input (TDI): serial input of the shift register;
2. test data out (TDO): serial output of the shift register;
3. test clock (TCK): the clock signal for the entire test logic system;
4. test mode select input (TMS): this line determines into which subsequent state the state machine of the test access port skips upon the next positive signal edge of the TCK signal; and
5. test reset (reset of the test logic system): this signal is optional.

Multiple integrated circuits may be connected to a JTAG interface. This results in a series connection of the shift registers of the affected ICs.

The TAP controller is a state automaton which is clocked by the TCK and controlled by the TMS line. The TMS line determines into which subsequent state a skip is made during the next clock pulse. The TAP controller has six stable states, i.e., states in which the system may remain for multiple clock pulses.

JTAG thus provides an at least partially standardized interface. A microcontroller may be accessed via this interface without assistance from the microcontroller.

Various methods and languages are known for accessing the microcontroller via the standardized interface, the TAP with the aid of the TAP controller, which may be described as a state machine. Such a language or file format is the so-called Serial Vector Format (SVF), for example.

SVF is a file format for exchanging boundary scan test vectors. SVF was developed with the aim of describing JTAG operations regardless of the manufacture.

SVF files contain a sequence of SVF instructions which describe how the JTAG state machine is to be run through. The two essential commands are the scan instruction register (SIR) and the scan data register (SDR) shift instructions. SIR carries out a shift operation into the instruction register, and SDR carries out a shift operation into the data register that is active at that moment, in each case with an indicated number of bits.

SVF is an ASCII format that is easily read and modified.

A disadvantage of SVF is that the states of the state machine of the TAP controller may run through only in a predetermined manner. If this is not sufficient, it is not possible to use SVF.

SUMMARY OF THE INVENTION

Against this background, a method for controlling an electronic unit according to Patent Claim 1 and a system for carrying out the method having the features of Claim 7 are presented. Further embodiments of the present invention result from the dependent patent claims and the description.

The presented method allows a state machine to be controlled, and not just executing or describing predefined paths in the process. This is particularly important for controlling a TAP controller as a JTAG interface.

A microcontroller is accessed via the JTAG interface without the need for assistance from the microcontroller. SVF, which represents a known script that is standardized, cannot be used in this case. Any given path within the state machine may be taken using the presented method. This is particularly important for microcontrollers, which require a path through the TAP controller that is not covered by SVF.

In the method, a script is used which is created using a language, i.e., a programming language. Such a language is also referred to as script language. Script languages are programming languages that are primarily used for small, manageable programming tasks. Programs that are written in a script language are referred to as scripts.

The language used allows scripts to be generated which allow access to the JTAG interface via a system configured for this purpose, i.e., hardware, regardless of the process manufacturer and the chip.

One advantage of the presented method is the complete flexibility due to generating arbitrary hardware-related sequences for the JTAG TAP controller of the microcontroller; i.e., firmware does not have to be modified in order to, for example, assist new derivatives of the microcontroller or other manufacturers of the microcontroller with new or different JTAG commands. A tool-assisted generation of the corresponding scripts (ASCII file) is made possible.

However, exact knowledge of the hardware (JTAG TAP controller) is necessary for generating the correct sequences.

In principle, two commands may be used, namely, "step," which takes a path without exchanging data, and "data transfer" or "data," in which a path is taken and data are exchanged. In addition, a loop mechanism may be carried out.

Command:
step
Parameter:
TDI value
number of steps
TMS sequence or bit sequence
Properties:
generates a number of rising TCK edges and the specified TMS sequence
TDI remains constant as specified
Command:
data transfer
Parameter:
number of bits
TMS sequence
TDI sequence
expected TDO sequence
TDO bit mask
Retry count (x)
definition of a step sequence in order to move the TAP controller back to the start of the data transmission, so that the number of repetitions of this step sequence is displayed
Properties:
generates a number of TCK clock pulse edges using the specified TMS and TDI signals
data transmission is repeatedly carried out until TDO agrees with the expected value, or a number of repetitions are exceeded
Further commands may be as follows:
Command:
request JTAG
Parameter:
initial values for TMS, TDI
Properties:
JTAG signals are not modified during execution of the command (i.e., no generation of a TCK edge, TCK is high) bus ownership remains until the explicit release via the "release JTAG" command
Command:
Release JTAG
Parameter:
None
Properties:
JTAG signals are not modified during execution of the command (i.e., no generation of a TCK edge, TCK is high) bus ownership is released The "request" and "release" commands are necessary only when multiple competing interface devices are connected to a JTAG interface.

Further advantages and embodiments of the present invention result from the description and the appended drawings.

It is understood that the features mentioned above and to be explained below are usable not only in the particular stated combination, but also in other combinations or alone without departing from the scope of the present invention.

DETAILED DESCRIPTION

The exemplary embodiments and/or exemplary methods of the present invention are schematically illustrated in the drawings with reference to specific embodiments, and is described in greater detail below with reference to the drawings.

Figure 1:
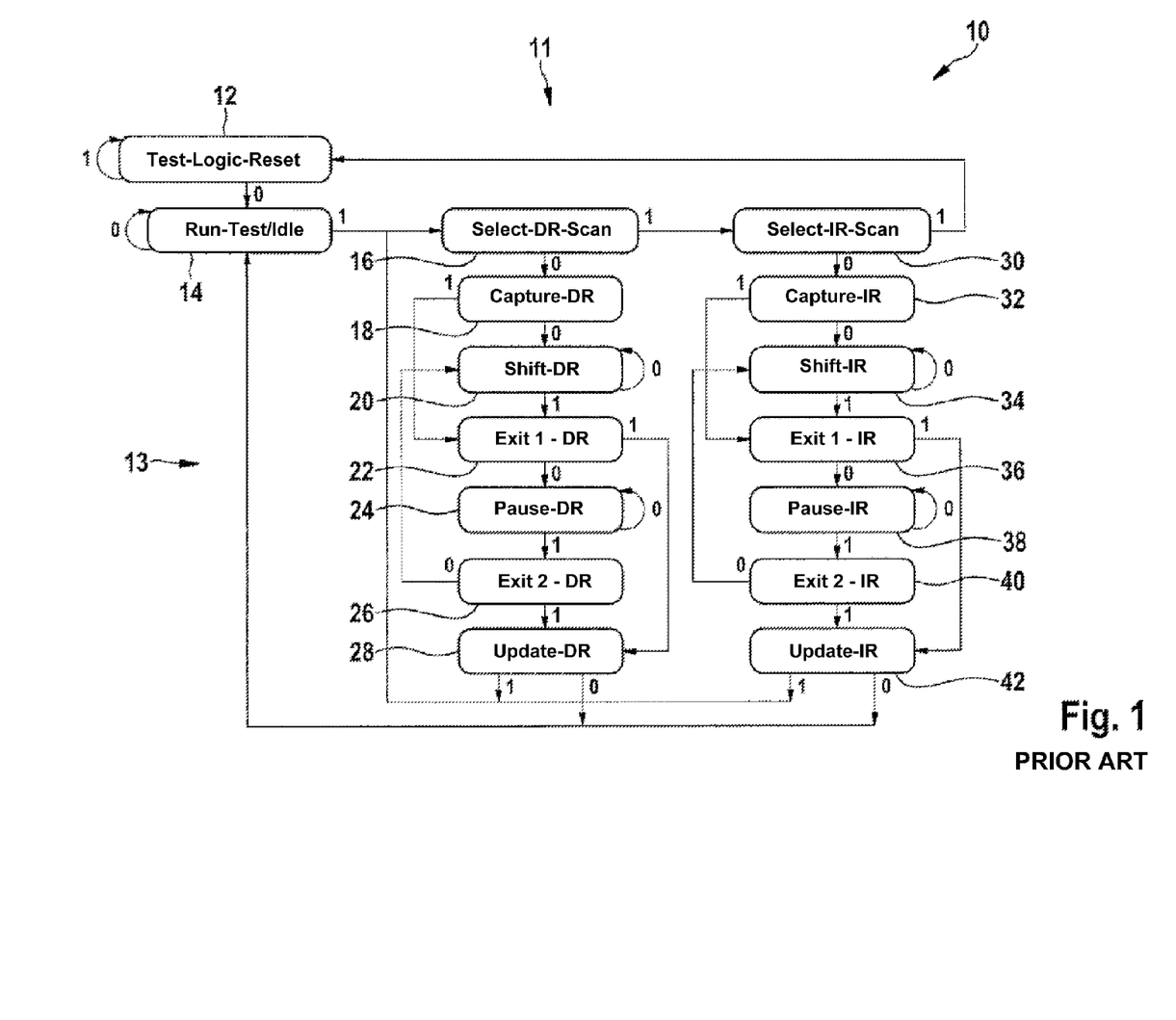
FIG. 1 shows a TAP controller in a state diagram.

FIG. 1 illustrates in a state diagram 10 a TAP controller 11 which is used to control a test logic system. This TAP controller 11 represents a state machine 13 whose behavior is described by state diagram 10. The illustration shows a number of states and state transitions. The following states are shown: TEST-LOGIC-RESET 12, RUN-TEST/IDLE 14, SELECT-DR-SCAN 16, CAPTURE-DR 18, SHIFT-DR 20, EXIT1-DR 22, PAUSE-DR 24, EXIT2-DR 26, UPDATE-DR 28, SELECT-IR-SCAN 30, CAPTURE-IR 32, SHIFT-IR 34, EXIT1-IR 36, PAUSE-IR 38, EXIT2-IR 40, UPDATE-IR 42.

Data input and data output are carried out in the states denoted by reference numerals 20 and 34, respectively. Illustrated state diagram 10 corresponds to the JTAG standard.

One sequence, i.e., a succession of state transitions, which cannot be demonstrated using SVF is as follows:
state 14—state 16—state 18—state 20—state 22—state 24—state 26—state 28—state 14

Figure 2:
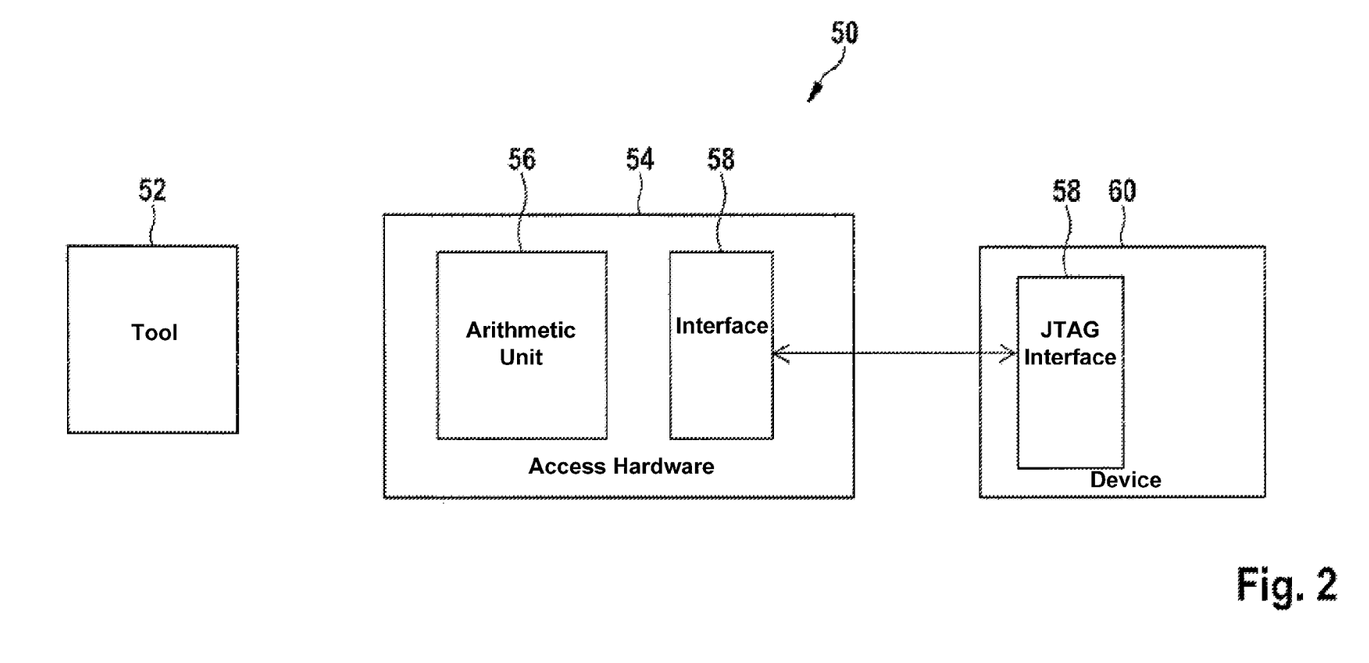
FIG. 2 shows one system for carrying out the presented method, in a schematic illustration.

FIG. 2 shows one of a system for carrying out the presented method, and is denoted overall by reference numeral 50. The illustration shows a tool 52 on which a script is stored. In addition, access hardware 54 having an arithmetic unit 56 and an interface 58 is depicted. This interface 58, a JTAG interface, for example, represents the connection to a device 60.

The script in tool 52 defines, on a relatively abstract level, which data are transmitted via interface 58 to device 60. Arithmetic unit 56 executes the script, and for this purpose uses interface 58 which is present in access hardware 54.

Figure 3:
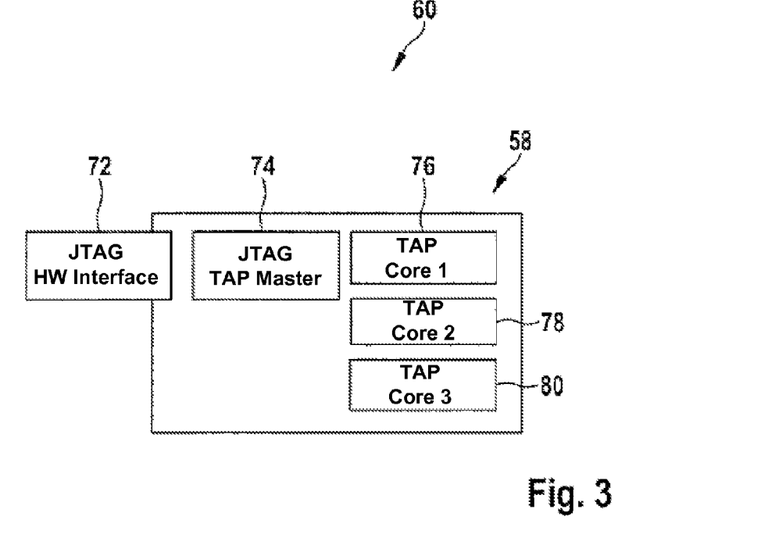
FIG. 3 shows one interface controller.

FIG. 3 shows device 60 from FIG. 2, and in particular shows interface 58 in a detailed view. This interface is configured as a multi-core controller, and includes a JTAG HW IF (IF: interface) 72, a JTAG TAP master 74, a JTAG core (TAP core 1) 76, a JTAG core (TAP core 2) 78, and a JTAG core (TAP core 3) 80. Control lines TCK, TMS, TDI, TDO, and optionally TRST are applied at JTAG interface 72, and registers are associated with each of JTAG cores 76, 78, and 80.

It should be noted that each JTAG IF in the controller (TAP) implements the JTAG state automaton. JTAG HW IF 72 terminates in a JTAG master 74. There are frequently special commands for directing the access from JTAG master 74 to another JTAG TAP. To direct the access from a JTAG TAP back to master 74 or to another TAP, the JTAG state automaton must generally be run through in a special sequence.

FIG. 3 illustrates one option of a JTAG implementation in which a special sequence must be run through which cannot be demonstrated using SVF.

Figure 4:
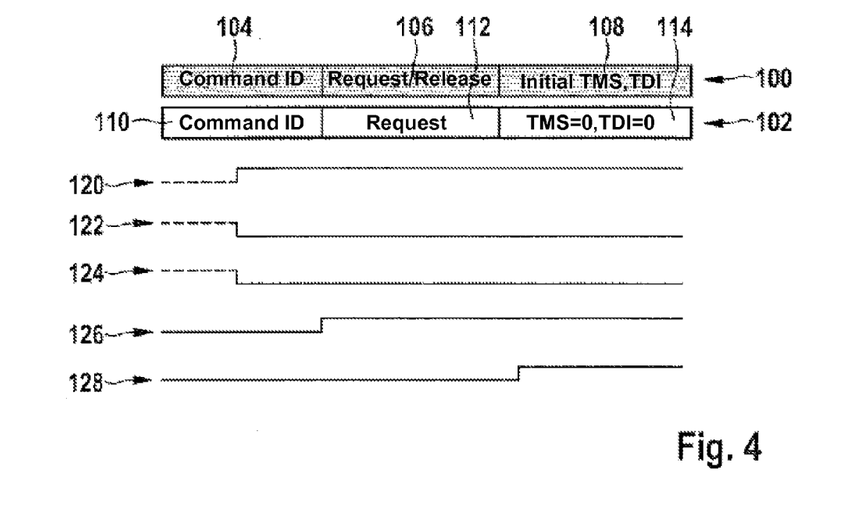
FIG. 4 shows signal curves for the "request/release JTAG bus" command.

FIG. 4 illustrates a time diagram for the "request JTAG" command. The illustration shows, in addition to the curve of the signals at the control lines, the structure of the command, namely, the general command structure in a first row 100 and the specific command structure in a second row 102. In the first row, a first block 104 contains the command identifier (7 bits), a next block 106 contains the assignment rule 1=request, 0=release (1 bit), and a third block 108 contains an assignment for initial values for TMS, TDI (8 bits). In second row 102, a first block 110 includes the command identifier (7 bits), a second block 112 includes the assignment "1"="request," and a third block 114 includes the assignments TMS="0," TDI="0."

The corresponding curves of the signals at the control lines are illustrated thereneath, namely, TCK 120, TMS 122, TDI 124, BREQ 126, and BGRANT 128.

Figure 5:
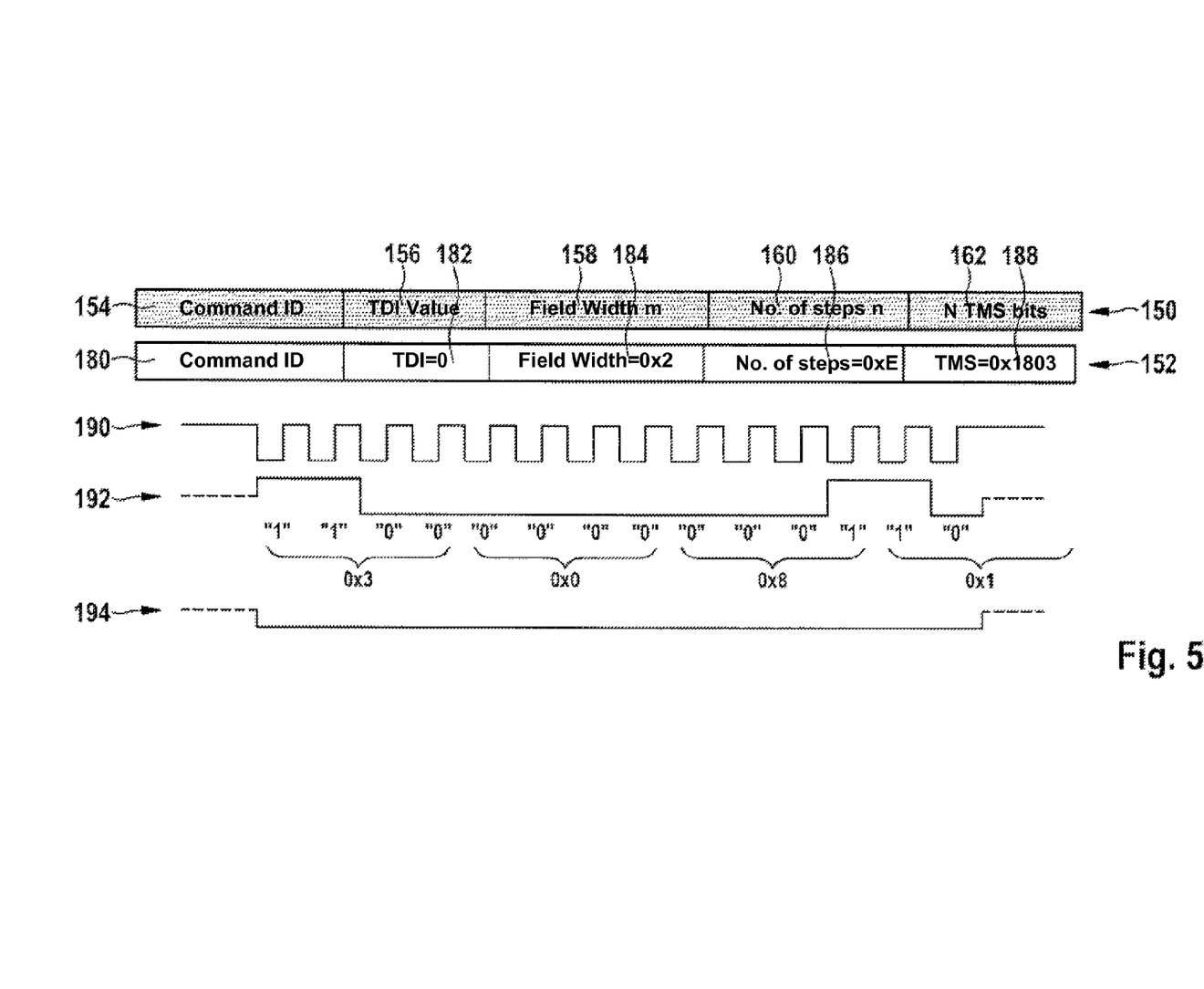
FIG. 5 shows signal curves for the "step" command.

FIG. 5 illustrates a time diagram for one example of the "step" command. The basic command structure is illustrated in a first row 150. A second row 152 includes a specific command structure.

First row 150 includes a first block 154 for the command identifier (8 bits), a second block 156 for the TDI value (8 bits), a third block 158 for field width m in bytes (8 bits), a fourth block 160 for number of steps n (8 bits), and a fifth block 162 for an assignment "N TMS bits" (N≤m * 8).

Second row 152 includes a first block 180 having a command identifier (8 bits), a second block 182 having an assignment TDI="0," a third block 184 having an assignment "field width=0x2," a fourth block 186 having an assignment "number of steps=0xE," and a fifth block 188 having an assignment "TMS=0x1803."

The corresponding curves of the signals at the control lines are illustrated thereneath, namely, TCK 190, TMS 192, and TDI 194.

Figure 6:
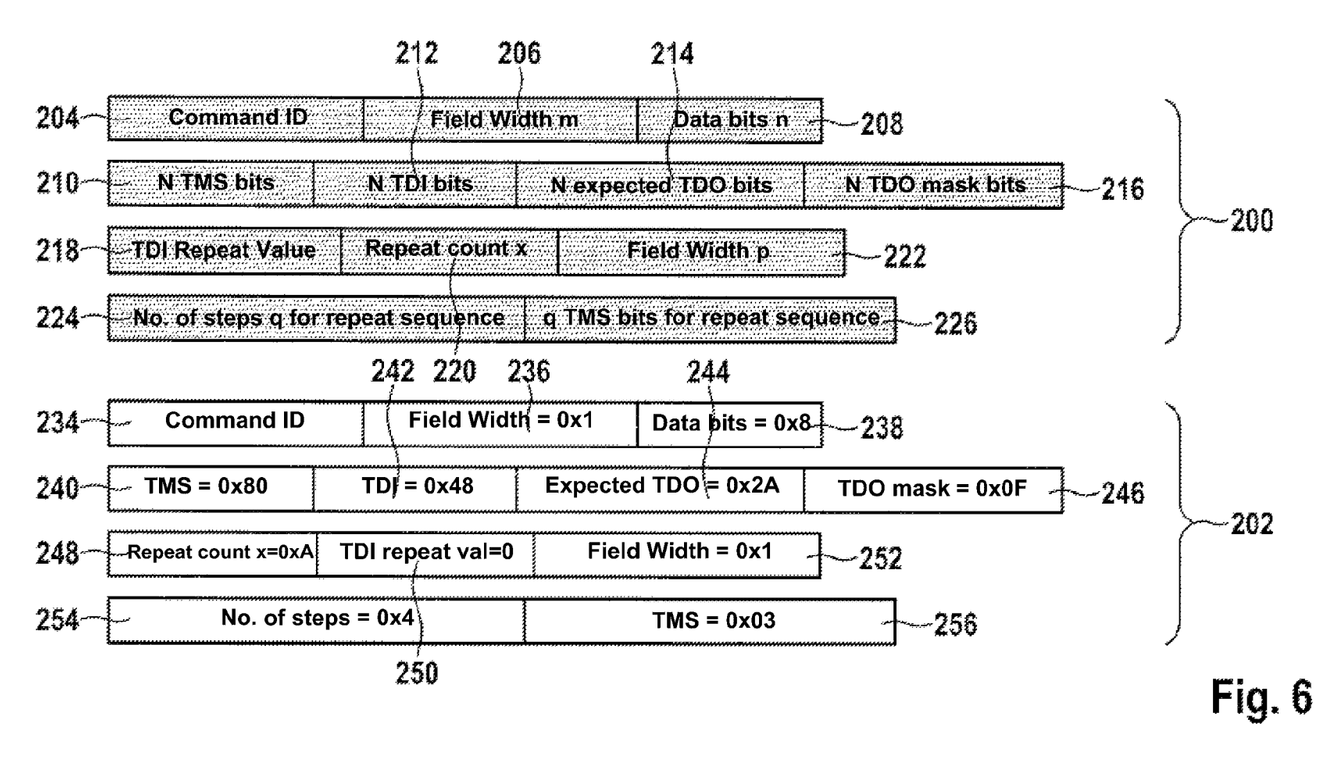
FIG. 6 shows the command structure of the "data" command.

FIG. 6 illustrates in a first row 200 the general command structure of the data command, and in a second row 202, a specific structure of the data command.

First row 200 includes a first block 204 having a command identifier (8 bits), a second block 206 having an assignment for field width m in bytes (8 bits), a third block 208 containing information concerning data bits n (8 bits), a fourth block 210 having an assignment "n TMS bits" (m * 8 bits), a fifth block 212 having an assignment "n TDI bits" (m * 8 bits), a sixth block 214 having an assignment "n expected TDO bits" (m * 8 bits), a seventh block 216 having an assignment "n TDO mask bits" (m * 8 bits), an eighth block 218 having the assignment "TDI repeat value" (8 bits), a ninth block 220 having a repeat count x (8 bits), a tenth block 222 for indicating field width p in bytes (8 bits), an eleventh block 224 for indicating number of steps q for repeat sequence (8 bits), and a twelfth block 226 having an assignment "q TMS bits for repeat sequence" (p * 8 bits).

Second row 202 includes a first block 234 having a command identifier (8 bits), a second block 236 having an assignment for field width =0x1, a third block 238 containing information concerning the data bits=0x8, a fourth block 240 having an assignment "TMS=0x80," a fifth block 242 having an assignment "TDI=0x48," a sixth block 244 having an assignment "expected TDO=0x2A," a seventh block 246 having an assignment "TDO mask=0x0F," an eighth block 248 having the assignment "repeat count x=0xA," a ninth block 250 having the assignment "TDI repeat value =0," a tenth block 252 for indicating the field width=0x1, an eleventh block 254 for indicating the number of steps=0x4, and a twelfth block 256 having an assignment "TMS=0x03."

Figure 7:
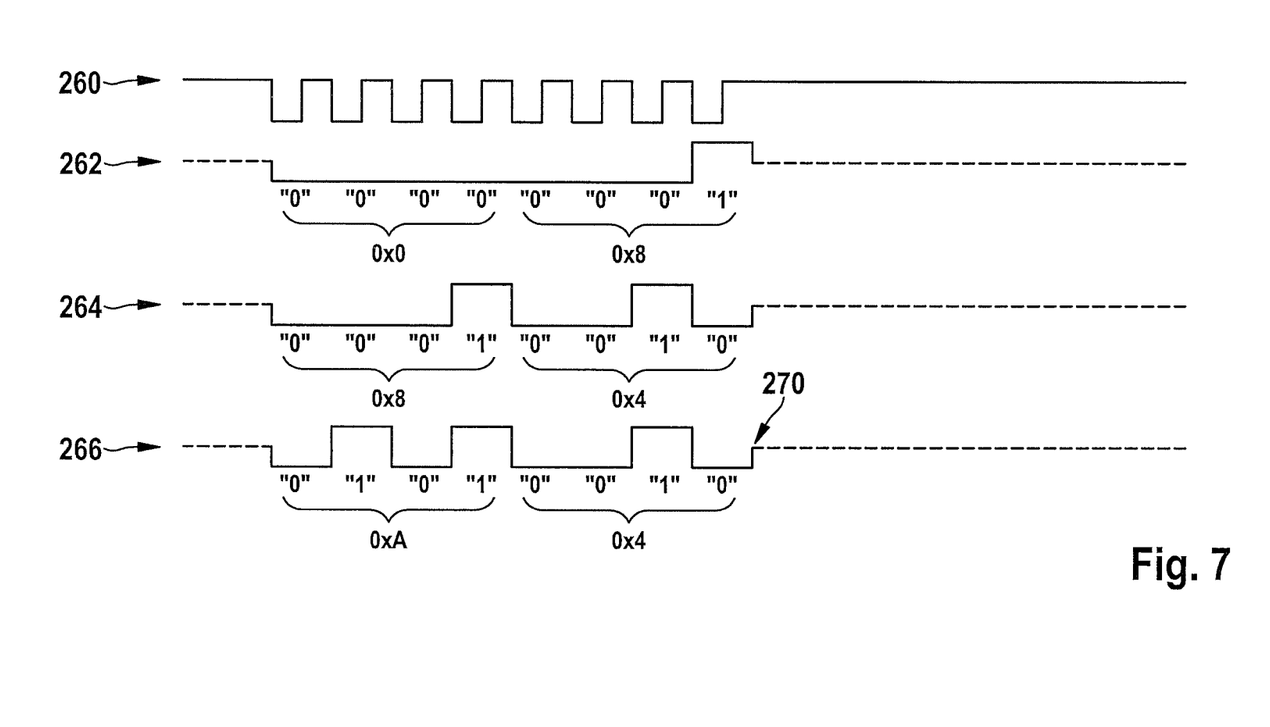
FIG. 7 shows signal curves of the "data" command.

The corresponding curves at the signal inputs are illustrated in FIG. 7, namely, TCK 260, TMS 262, TDI 264, and TDO 266. This means that the illustrated signal curves are to be applied to the signals in order to execute the mentioned command.

FIG. 7 consequently illustrates a time diagram for one example of the data transfer command which has successfully concluded; i.e., the TDO value corresponds to the expected TDO value, taking the mask into account. This is ascertained at a point in time 270.

Figure 8:
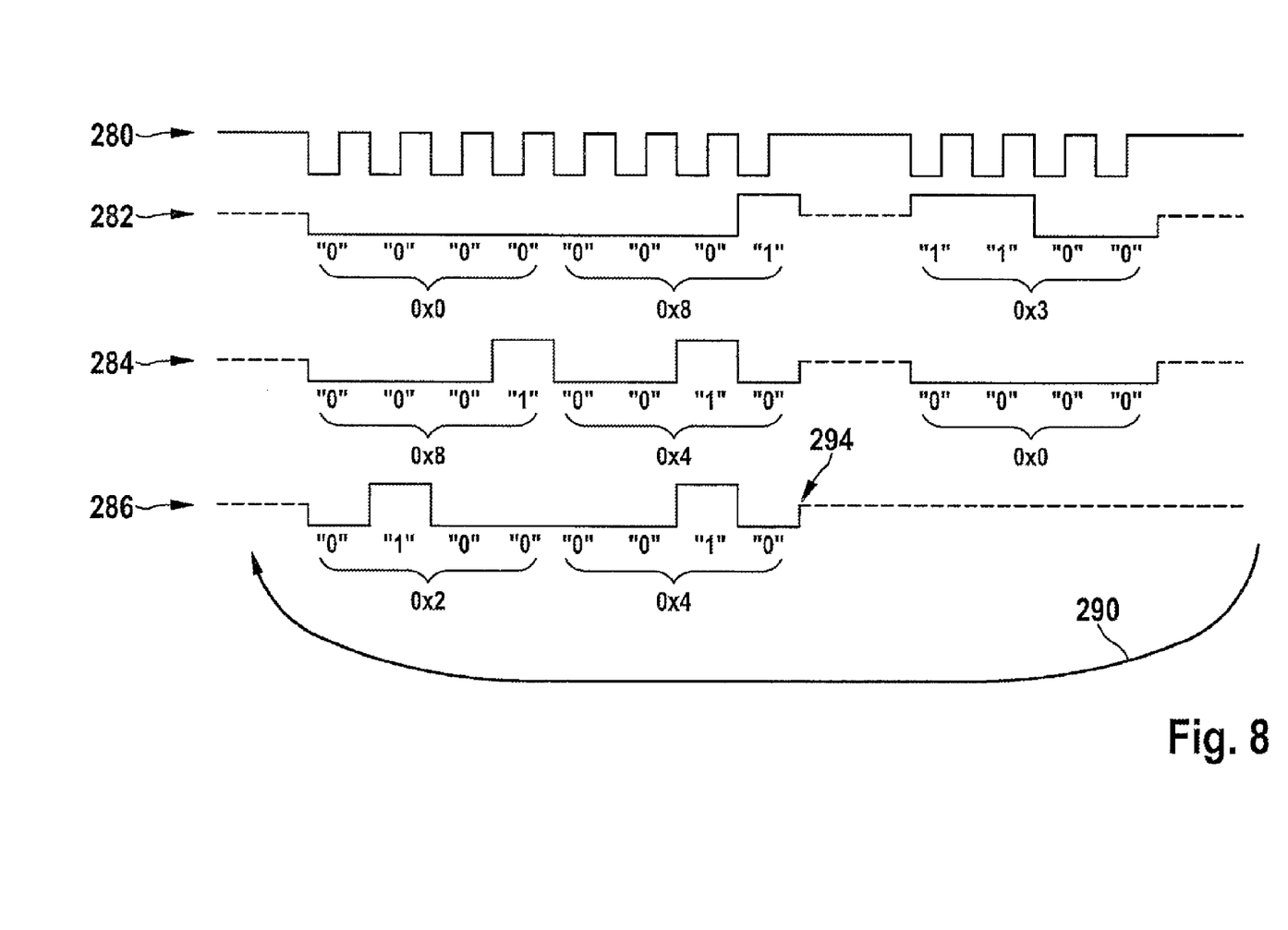
FIG. 8 shows signal curves of the "data" command.

FIG. 8 corresponds to FIG. 7, except without a successful conclusion; i.e., the access is repeated if the maximum number has not been reached. The curves at the signal inputs are depicted, namely, TCK 280, TMS 282, TDI 284, and TDO 286. The sequence is repeated up to ten times, for example (arrow 290). The TDO value is checked at a point in time 294.

The presented method allows a path from one state to a next state to be explicitly specified. In contrast to SVF, no implicit transitions are determined.

The device to be tested, which may include software and/or hardware, may be externally influenced in a targeted manner. This may be used for testing the device, although possible applications are not limited thereto. Thus, the behavior of a control unit may be modified without the control unit having to actively assist the process.

What is claimed is:

1. A method for testing a hardware device, the method comprising:
    receiving, by a testing circuit and from an external control unit, program commands; and
    executing, by the testing circuit, the received program commands, thereby controlling the hardware device to cause the hardware device to perform data processing, output of which is compared by the testing circuit to expected output, thereby testing the hardware device, wherein:
        the execution of the received program commands causes the testing circuit to transition between state machine states into which the testing circuit is configured to transition;
        at least a subset of the program commands are data commands that instruct respective transitions between states of the state machine to be implemented, the instructed respective transitions including respective data exchanges between the testing circuit and the hardware device; and
        for each of the states of the state machine:
            state transitions of the testing circuit from the respective state are not limited by the testing circuit to any one subsequent state based on a prior sequence of state transitions; and
            the testing circuit is configured to select one of the states to which to transition from the respective state depending on a respective one of the program commands, so that the received program commands define a string of transitions between states of the state machine.

2. The method of claim 1, wherein the received program commands include a step command that instructs a respective state machine transition without a corresponding data exchange.

3. The method of claim 1, wherein test steps performed by the testing circuit in accordance with the received program commands are repeatable independently of a result of the data processing performed by the hardware device.

4. The method of claim 1, wherein the testing circuit includes a Joint Test Action Group (JTAG) interface controlled to transition between states of the state machine, the state machine defining a test access port (TAP).

5. The method of claim 1, wherein the received commands include a request command by execution of which the testing circuit places a specified device in focus and a release command by execution of which the testing circuit releases a device from being in focus.

6. A system for testing a hardware device, the system comprising:
   processing circuitry; and
   a testing circuit configured to:
      receive from the processing circuitry program commands; and
      execute the received program commands, thereby controlling the hardware device to perform data processing, output of which is compared by the testing circuit to expected output, thereby testing the hardware device;
   wherein:
      the execution of the received program commands causes the testing circuit to transition between state machine states into which the testing circuit is configured to transition;
      at least a subset of the program commands are data commands that instruct respective transitions between states of the state machine to be implemented, the instructed respective transitions including respective data exchanges between the testing circuit and the hardware device; and
      for each of the states of the state machine:
         state transitions of the testing circuit from the respective state are not limited by the testing circuit to any one subsequent state based on a prior sequence of state transitions; and
         the testing circuit is configured to select one of the states to which to transition from the respective state depending on a respective one of the program commands, so that the received program commands define a string of transitions between states of the state machine.

7. The system of claim 6, wherein the testing circuit includes a Joint Test Action Group (JTAG) interface that is controlled to transition between states of the state machine, the state machine defining a test access port (TAP).

8. The method of claim 1, wherein the program commands include a command for a shift operation into an instruction register, and wherein the data commands include a command for a shift operation into a data register.

* * * * *